United States Patent [19]
Liu et al.

[11] Patent Number: 6,100,205
[45] Date of Patent: Aug. 8, 2000

[54] INTERMETAL DIELECTRIC LAYER FORMATION WITH LOW DIELECTRIC CONSTANT USING HIGH DENSITY PLASMA CHEMICAL VAPOR DEPOSITION PROCESS

[75] Inventors: Chih-Chien Liu, Taipei; J. Y. Wu; Tsang-Jung Lin, both of Hsin-Chu; Water Lur; Shih-Wei Sun, both of Taipei, all of Taiwan

[73] Assignee: United Microelectronics Corp., Hsin-Chu, Taiwan

[21] Appl. No.: 08/958,828

[22] Filed: Oct. 28, 1997

Related U.S. Application Data

[60] Provisional application No. 60/041,792, Apr. 2, 1997.

[51] Int. Cl.[7] .................................................. H01L 21/31
[52] U.S. Cl. .......................... 438/788; 438/778; 257/522; 257/750; 257/758
[58] Field of Search ..................................... 438/624, 639, 438/694, 701, 702, 422, 424, 619, 734, 778, 788; 257/522, 750, 758

[56] References Cited

U.S. PATENT DOCUMENTS

| | | | |
|---|---|---|---|
| 5,510,645 | 4/1996 | Fitch et al. | 257/522 |
| 5,731,241 | 3/1998 | Jang et al. | 438/424 |
| 5,814,555 | 9/1998 | Bandyopadhyay et al. | 438/619 |
| 5,880,030 | 3/1999 | Fang et al. | 438/701 |

OTHER PUBLICATIONS

J.T. Pye, et al., "High–Density Plasma CVD and CMP for 0.25–$\mu$m Intermetal Dielectric Processing," Solid State Technology, Dec. 1995, pp. 65–69.

*Primary Examiner*—David Nelms
*Assistant Examiner*—Reneé R. Berry
*Attorney, Agent, or Firm*—Rabin & Champagne, P.C.

[57] ABSTRACT

A method for depositing dielectric material into gaps between wiring lines in the formation of a semiconductor device includes the deposition of dielectric layers using high density plasma chemical vapor deposition (HDPCVD). A first HDPCVD step is carried out to form a first dielectric layer over the wiring lines and into the gaps between wiring lines. A PECVD step is carried out to deposit dielectric material over the first dielectric layer and within and to define a opening in the gap. A second HDPCVD step is carried out and the opening defined by the PECVD step is capped by a third dielectric layer. The method allows air-filled voids to be formed between adjacent metal wiring lines in a highly controlled manner which allows selection of the shape of the voids and precise location of the top of the voids. In addition, the voids are sealed by a denser and more durable material than is typical.

35 Claims, 5 Drawing Sheets

INTERMETAL DIELECTRIC LAYER FORMATION WITH LOW DIELECTRIC CONSTANT USING HIGH DENSITY PLASMA CHEMICAL VAPOR DEPOSITION PROCESS

This application claims priority from provisional application Serial No. 60/041,792, filed Apr. 2, 1997.

BACKGROUND OF THE INVENTION

1. Field of the Invention

The present invention relates to the formation of an insulating region between conducting structures in a semiconductor circuit.

2. Description of the Related Art

Many highly integrated semiconductor circuits utilize multilevel wiring line structures for interconnecting regions within devices and for interconnecting one or more devices within the integrated circuits. In forming such structures, it is conventional to provide first or lower level wiring lines or interconnect structures and then to form a second level wiring line in contact with the first level wiring lines or interconnect structures. A first level interconnect might be formed in contact with a doped region within the substrate of an integrated circuit device. Alternately, a first level interconnect might be formed to a polysilicon or metal wiring line that is in contact with one or more device structures in or on the substrate of the integrated circuit device. One or more interconnections are typically formed between the first level wiring line or interconnect and other portions of the integrated circuit device or to structures external to the integrated circuit device. This is accomplished, in part, through the second level of wiring lines.

Intermetal dielectric materials are provided between adjacent wiring lines within layers and between wiring lines on different levels. The dielectric materials are used to fill the gaps between adjacent wiring lines so that subsequent layers of materials deposited over the wiring lines do not extend between the wiring lines. Because the dielectric materials are generally left in place in the completed integrated circuit device, it is desirable for the dielectric materials to have certain characteristics. It is desirable that the dielectric material be highly insulative, provide significant levels of passivation to the surface of the typical metal wiring lines covered by the dielectric materials, and provide a moisture barrier to protect the wiring lines from the atmosphere through the life of the integrated circuit device. Other requirements for the dielectric materials provided between the wiring lines of the integrated circuit device relate to the performance of the integrated circuit device. Adjacent wiring lines couple to each other both capacitively and inductively through the dielectric materials that separate the wiring lines. Excessive levels of coupling between adjacent wiring lines slows the transmission of signals by the wiring lines, slowing circuit performance. As such, various efforts have been made to limit the dielectric constant of the dielectric materials that separate adjacent wiring lines.

As devices are scaled to smaller geometries, the gaps between wiring lines become smaller and it becomes ever more important to reduce the dielectric constant of the dielectric materials used to fill the gaps between wiring lines. This is particularly true for modern integrated circuit devices which emphasize not only closer spacings between wiring lines but also higher operating speeds so that there is a reduced margin for the slowing produced by excessive levels of capacitive and inductive coupling. Thus, modern integrated circuit devices need reduced dielectric constants to obtain the desirable reduced levels of capacitive and inductive coupling between adjacent wiring lines. One strategy for reducing the dielectric constant of the materials has been to replace conventional dielectric materials with new material having comparatively low dielectric constants, including fluorinated oxides and fluorinated carbon films. These materials do not yet provide an acceptable alternative to more conventional dielectric materials because of processing difficulties and unreliability. A different strategy that has been attempted has been to incorporate air-filled gaps or spaces within the dielectric materials that separate the wiring lines. The appeal of using air as a dielectric material between dielectric lines is that air closely approaches the theoretical minimum dielectric constant for a dielectric material. Air-filled gaps also have not been acceptably implemented in modem integrated circuits, particularly since use of air-filled gaps tend to reduce the reliability of integrated circuits in which they are incorporated and reduce the yields from processes subsequent to the formation of air-filled gaps.

Dielectric layers for wiring line isolation are often formed by chemical vapor deposition (CVD) processes, which deposit a material onto a surface by transporting certain gaseous precursors to the surface and causing the precursors to react at the surface. Common CVD methods are atmospheric-pressure CVD (APCVD), low-pressure CVD (LPCVD) and plasma enhanced CVD (PECVD). High quality APCVD and PLCVD oxides may be deposited at high temperatures (650–850° C.), but such temperatures are generally not compatible with preferred wiring line materials such as aluminum. Lower temperature APCVD and LPCVD processes yield oxides that are porous and water absorbing and that may be poorly suited to use as intermetal dielectrics. Acceptable oxides for gap-filling have been formed using PECVD processes, which use a plasma to impart additional energy to the reactant gases. The additional energy supplied by the plasma enables PECVD processes to be carried out at lower temperatures (approximately 400° C. and less) than APCVD or LPCVD processes.

The most common dielectric material deposited for metal line isolation is silicon dioxide. It would be desirable to utilize materials having a lower dielectric constant than that of silicon dioxide to reduce the capacitive coupling between adjacent wiring lines and to enhance circuit performance.

SUMMARY OF THE PREFERRED EMBODIMENTS

One aspect of the present invention provides a method of making a semiconductor device isolation structure using a high density plasma chemical vapor deposition (HDPCVD) process. Embodiments of this aspect include a method for forming a semiconductor device comprising the steps of providing a substrate having a surface and at least two structures requiring electrical isolation from each other on the substrate surface, wherein the two structures are separated from one another by a gap on the substrate surface. A first dielectric layer is deposited over the two structures and within the gap, using high density plasma chemical vapor deposition. A second dielectric layer is deposited over the first dielectric layer, using plasma enhanced chemical vapor deposition. A third layer is deposited over a portion of the second dielectric layer, using high density plasma chemical vapor deposition, and a void is formed in the gap, the void defined by a portion of the second dielectric layer and a portion of the third dielectric layer.

Other embodiments include a method for depositing dielectric material comprising the steps of providing at least two conducting structures above a substrate, the conducting structures separated by a gap. A plasma-enhanced chemical vapor deposition dielectric layer is formed over the conducting structures and gap. An opening is formed in the gap, the opening at least partially defined by the plasma-enhanced chemical vapor deposition dielectric layer. A high density plasma chemical vapor deposition dielectric layer is formed over at least a portion of the plasma-enhanced chemical vapor deposition dielectric layer, the high density plasma chemical vapor deposition dielectric layer forming a cap to seal off the opening.

Additional embodiments include a method for forming a structure including a via, comprising the steps of providing a substrate having at least one conducting structure thereon, the conducting structure having a top surface. A high density plasma chemical vapor deposition material is deposited adjacent to the conducting structure, and a dielectric material is deposited above the conducting structure. A via is formed through the dielectric material and contacting the top surface of the conducting structure, wherein the via also contacts a portion of the high density plasma chemical vapor deposition material adjacent to the top surface of the conducting structure. In another aspect of embodiments of the present invention, the via may be unlanded.

BRIEF DESCRIPTION OF THE DRAWINGS

Embodiments of the invention are described with reference to the accompanying drawings which, for illustrative purposes, are schematic and are not drawn to scale, where.

DESCRIPTION OF THE PREFERRED EMBODIMENTS

As devices are being scaled down to smaller geometries, the close spacing between wiring lines increases the capacitive coupling between the lines and limits the speed of circuits that incorporate the wiring lines. The capacitive coupling between lines is reduced by using a reduced dielectric constant material between the wiring lines. CVD silicon oxide has a dielectric constant of about 3.9 on the comparative scale where 1.0 represents the dielectric constant of a vacuum. Air has a comparatively much lower dielectric constant of only slightly more than 1.0. Voids can be formed within the gaps between wiring lines during semiconductor device fabrication that have a low dielectric constant using techniques such as PECVD to deposit dielectric material in a manner that encloses voids within the dielectric material deposited between the wiring lines. It may be difficult to predict precisely what gas, at what pressure, will be inside of the void formed during plasma deposition processes. Typically, an ambient gas environment such as $N_2$ or argon in addition to reactant gases will be present during the process. Such gases will provide a void having a dielectric constant of only slightly more than 1.0. The exact size and position of such voids in relation to the adjacent wiring lines is difficult to control. Consequently, the voids may be uncovered during subsequent processing steps such as polishing or etching, allowing contaminants to be trapped in the voids, leading to reduced yields and/or decreased device performance caused by the contamination. Controlling the size and position of voids is particularly important if the favorable dielectric properties of air-filled voids are to be used in high-volume manufacturing processes.

Preferred embodiments of the present invention utilize high density plasma chemical vapor deposition (HDPCVD) to selectively fill portions of the gaps between wiring lines in a manner that shapes, positions and covers the voids. Practice of these preferred embodiments allows voids to be incorporated within the gaps between wiring lines in a reliable manner consistent with high volume production. HDPCVD processes allow for the formation of a hard capping layer over a void, which decreases the chances that the void will be uncovered during subsequent processing. By controlling the sputter component of HDPCVD processes through different stages of filling the gaps between wiring lines, a combination of etching and high energy deposition processes control the size and location of the voids within the gaps. According to certain preferred embodiments, three distinct layers are deposited to form and enclose voids in the gaps between wiring lines. The first dielectric layer is preferably deposited in an HDPCVD process having a first sputter rate over the tops and sides of the wiring lines and over the substrate between wiring lines. A second dielectric layer is deposited, preferably using PECVD, over the first dielectric layer so that the second dielectric layer selectively accumulates near the top sides of the wiring lines in a manner that partially defines a void having an opening at or near the top of the gap. A third dielectric layer is preferably deposited using HDPCVD to cap the void's opening with a hard, dense dielectric material. By using different deposition processes to deposit dielectric material within the gaps between wiring lines, preferred embodiments of the present invention form voids having preferred shapes and sizes at preferred positions within gaps defined between adjacent wiring lines. Desirably, the preferred methods form voids that are completely below the upper edges of adjacent wiring lines and which are capped by a layer of dense dielectric material that is more difficult to remove in subsequent etching or polishing processes. Practice of these preferred methods forms voids as part of the intermetal dielectric layer in a manner that is well compatible with the planarization process used in forming many modern integrated circuit devices.

High density plasma chemical vapor deposition (HDPCVD) systems have been developed which are capable of providing high quality dielectric layers at deposition temperatures significantly reduced from conventional CVD of dielectric layers. HDPCVD systems are commercially available (for example, from Novellus Systems, Inc.), which deposit a dielectric layer having density, moisture resistance and planarization properties which are superior to those of conventional CVD dielectric layers. The high density plasma, which mediates deposition in HDPCVD systems, may be generated from a variety of sources such as electron cyclotron resonance, inductively coupled plasma, helicon, and electrostatically shielded radio frequency. All of these plasma generation mechanisms allow for the addition and independent control of a bias sputter component to the deposition process. Manipulating the relative substrate bias can alter the deposition conditions, the energy of the CVD reactant gases and the extent of etching and sputtering processes that occur during deposition in a manner that makes it possible to deposit dielectric material into the gaps between conducting structures in a highly controlled intermetal dielectric deposition process. The bias sputter or etching component of the HDPCVD process can be controlled to selectively remove at least a portion of the dielectric material that builds up on the upper portions of the wiring line sidewalls during more conventional deposition processes. Such a build-up is observed when deposition methods such as PECVD are used to fill small gaps with oxides and is a contributing factor in the unpredictable void formation characteristic of conventional void formation processes, as illustrated in FIGS. 1 and 2.

Figure 1:
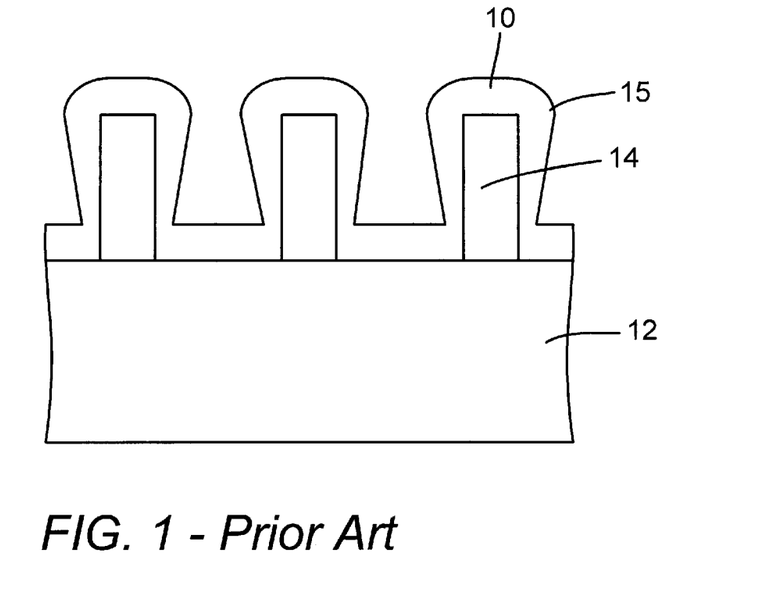
FIG. 1 illustrates the formation of a plasma-enhanced TEOS oxide layer as an intermetal layer, showing the formation of the oxide layer on the wiring lines and within the gaps between wiring lines, according to prior art deposition techniques.
Figure 2:
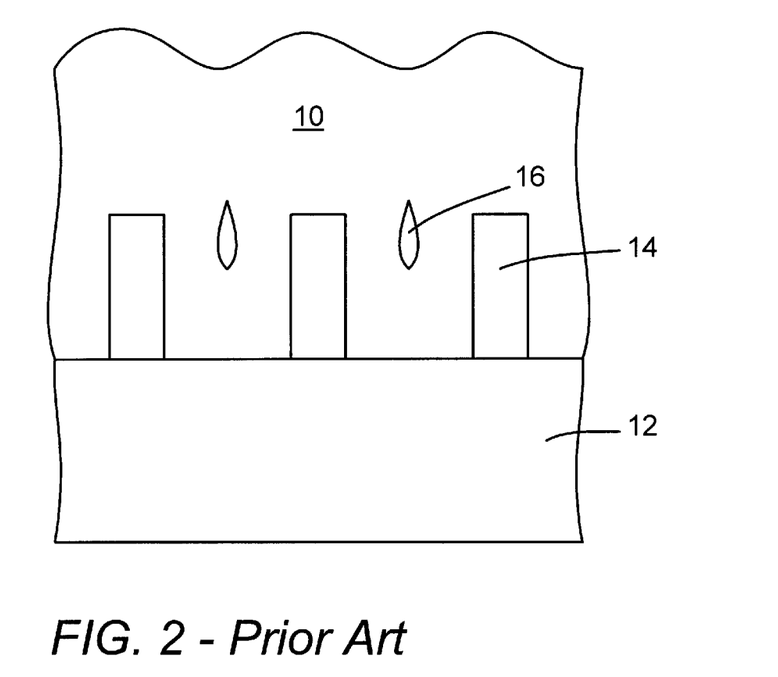
FIG. 2 illustrates the formation of voids in a plasma-enhanced TEOS oxide layer according to prior art deposition techniques.

As seen in FIG. 1, an oxide layer 10 deposited on substrate 12 using PECVD TEOS will build up on the upper corner regions of the sidewalls of wiring lines 14 and form overhang regions 15. As the deposition proceeds and the gap is filled, voids 16 between the wiring lines 14 can be formed, as shown in FIG. 2. These voids 16 may create channels that run parallel to adjacent metal lines 14 along their length. Subsequent planarization processes may uncover or partially open the voids and materials such as polishing chemicals or polymerized etch byproducts may become trapped in the voids. Material trapped in the voids may be difficult to remove. Subsequent processing steps then exhibit reduced yields due to contamination from the materials trapped in the voids. In addition, it is hard to predict the amount of build-up that will occur during the PECVD process and the amount of build-up may be different in different areas. As a result, the voids may have varying sizes and may be positioned at varying heights. FIG. 2 shows the voids 16 positioned so as to extend partially above the tops of the wiring lines 14. It would be desirable for the voids to be positioned entirely below the tops of the wiring lines to fully take advantage of their low dielectric constant. Positioning the voids so that the tops of the voids are reliably positioned at or below the edges of adjacent wiring lines is highly preferred because in such a geometry it is much more difficult to open the voids in a subsequent polishing process. When utilizing high density plasma CVD methods according to the present invention to fill gaps between wiring lines, a comparatively high bias sputter component HDPCVD process is used during portions of the dielectric deposition process to accelerate ions such as argon within the deposition chamber to bombard the deposition substrate. Such a non-reactive, ion-milling process removes dielectric material that deposits on the sidewalls of the wiring lines and can be controlled to help position the void within the gap in a consistent manner.

The bias sputtering component of HDPCVD derives from the introduction of an accelerating potential between the plasma-excited deposition gases and the deposition substrate. Such an acceleration potential may arise differently in different geometry systems. Commonly, part of the acceleration potential derives from the dc self-bias effect whereby a substrate held at a fixed potential develops a self-bias with respect to an adjacent plasma. The level of dc acceleration potential can be varied by varying the potential to which the substrate is tied. In most HDPCVD systems, an additional, independently variable rf bias is typically provided between one or more plates and the substrate. This independent rf bias allows for more complete control of the accelerating bias and the sputtering rate and helps to prevent the uneven charge build-up possible in a purely self-biased system.

The ions accelerated through the bias sputter component of HDPCVD processes etch the material present on the surface of the deposition substrate and sputter that etched material, generally to further recessed portions (i.e., farther from the ion flux) on the substrate. As an oxide is deposited onto the surface of a substrate by HDPCVD incorporating bias sputtering, the oxide is also etched from the surface of the substrate and sputtered into more recessed portions of the substrate. Typically, the ions that are most prevalent in the bias sputtering process are relatively inert argon ions, so comparatively little of the process proceeds through chemical mechanisms and the process primarily proceeds through a physical transport mechanism. The etch rate of oxide HDPCVD processes varies as a function of the angle of incidence of the etching ions, with normally incident ions etching at a slower rate than ions that are incident at higher angles. The effect of this angular dependence of the bias sputter component of HDPCVD is that the edges of structures are etched at a faster rate than the central portions of the structures. As such, those portions of a deposited layer that are closest to a gap are the most likely to be etched and sputtered into the gap. This produces surface faceting, which is a recognized characteristic of the HDPCVD process, along with the ability of the process to fill gaps effectively. It should be recognized that any plasma based process can exhibit sputter etching and deposition mechanisms. When the present inventors discuss sputtering rates in HDPCVD processes, the present inventors intend to convey a sputtering rate in comparison to a base line level of sputtering characteristic of a process such as PECVD.

Another advantage of the HDPCVD is that it is generally not necessary to perform subsequent high temperature densification steps, which may sometimes be required to density oxide layers deposited using conventional CVD and other techniques. Use of HDPCVD processes desirably reduces the number of process steps for making a device and minimizes exposure of the device to elevated temperatures. Embodiments of the present invention may include a gap filling procedure that has at least two and more preferably three distinct steps of depositing materials under different conditions to fill the gaps between wiring lines without adverse effects on the wiring lines.

HDPCVD processes may accomplish both deposition and etching at the same time, depending on the level of bias sputter component chosen for the deposition environment during the process. Bias sputtering can be used to remove and redistribute dielectric material from wiring line sidewalls to other regions in the gaps and enhances planarization. It should be noted that an excessive etching component during HDPCVD dielectric deposition may damage either wiring lines or one or more of the protective layers that might be provided over the wiring lines. Thus, the sputter component is preferably controlled or other process control variables are adjusted to protect the wiring lines and desired portions of the intermetal dielectric. Use of an HDPCVD process to position and seal voids in the gaps between wiring lines can be accomplished using a three step process as described below.

It should be appreciated that, while the present invention is described with reference to a particularly preferred embodiment in which three distinct stages of deposition are performed, variations on this process having more stages or even providing continuous variation between different etch and sputtering conditions may be desirable. These more complicated implementations of the present invention are presently less preferred because of their greater complexity and increased process variability. The three layers of the preferred gap fill structure perform particularly desirable functions in the invention's method. A first layer deposited near the wiring lines (or other conductors) is provided that may be formed from a process such as HDPCVD. Most preferably, the first layer is formed from a silicon rich oxide to provide a harder material for the first layer. A second layer is preferably provided using PECVD to deposit dielectric material in a manner that provides a build-up of material near the tops of the sidewalls of the wiring lines in order to form an opening in the dielectric material deposited within the gap which will become a void when closed off. A third layer is deposited using HDPCVD to complete the formation of the void by providing a cap over the opening. The presently preferred embodiments utilize oxides for the first, second and third layers, but it should be possible to utilize other materials provided appropriate deposition techniques are available.

Figure 3:
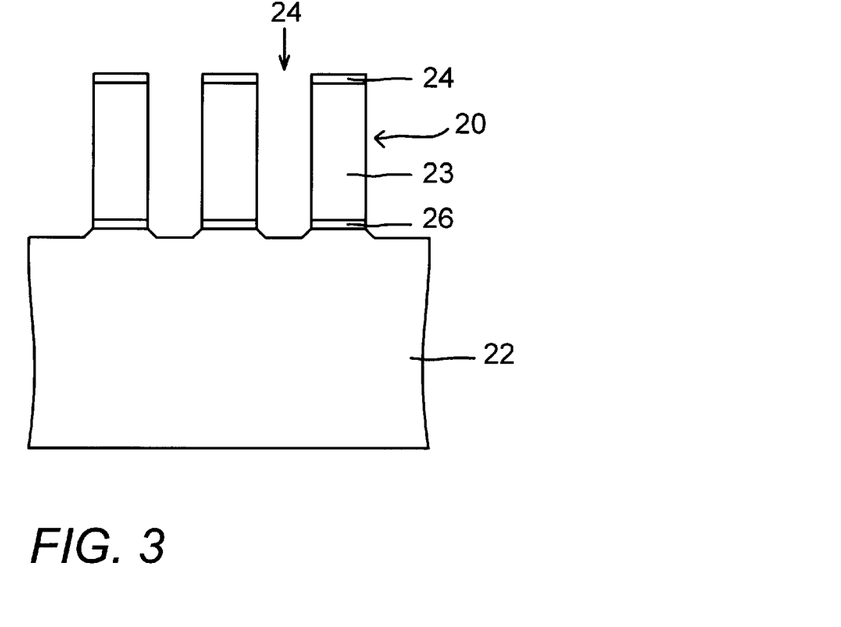
FIGS. 3–7 illustrate the processing steps in the formation of a integrated circuit device including high density plasma chemical vapor deposition and formation of voids between conducting structures according to embodiments of the present invention.

Preferred embodiments of the present invention may be described with reference to FIGS. 3–7. FIG. 3 shows a cross-sectional view of a semiconductor substrate having wiring lines 20 formed on a substrate 22. The wiring lines 20 include metal layer 23, which may be formed from a variety of materials, such as aluminum, aluminum alloyed with silicon or copper, copper, alloys including copper and multilayer structures including comparatively inexpensive metals and more expensive metals such as the refractory metals. Between the wiring lines 20 lie gaps 24. The substrate may contain a variety of elements, including, for example, transistors, diodes, and other semiconductor elements (not shown) as are well known in the art. The substrate 22 may also include other metal interconnect layers. Between the substrate 22 and metal layer 23 lies surface layer 26. If portions of the surface of the substrate 22 which make contact with the wiring lines are silicon and the metal layer 23 are aluminum, then layer 26 may comprise a material such as titanium nitride, titanium-silicide, or a titanium-tungsten alloy. In this configuration, layer 26 acts as a barrier to prevent interactions such as interdiffusion between the silicon and the aluminum. Layer 26 may also act to help adhere the metal layer 23 to the substrate 22 and may reduce electromigration tendencies in aluminum wiring lines. Protective layer 28, which may be the same material that makes up layer 26, may also be deposited on the metal layer 23. The protective layer 28 serves several functions, including protecting the metal layer 23, limiting electromigration, providing more reproducible contacts and acting as an antireflective coating under a layer of photoresist in a subsequent photolithography process.

Figure 4:
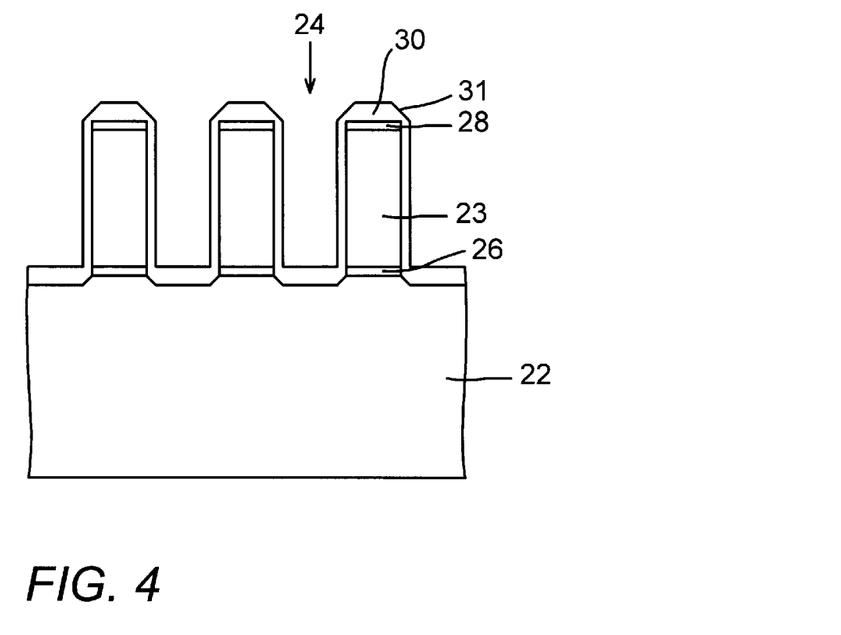
Figure 5:
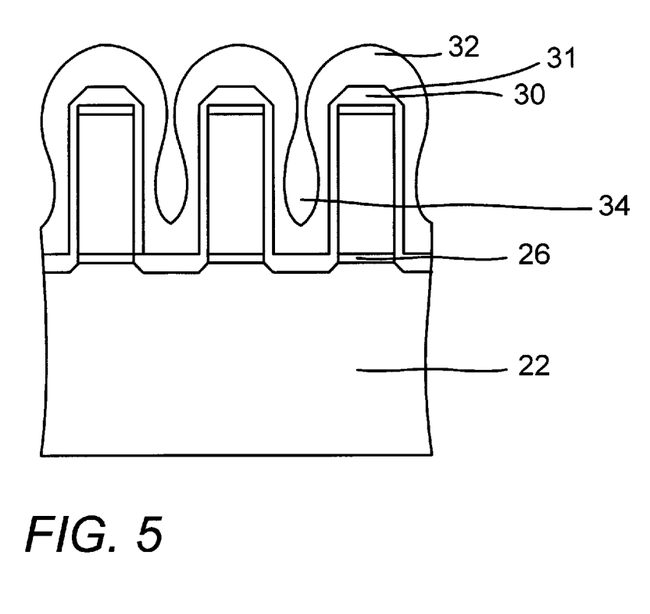

A first step is carried out to form first HDPCVD layer 30, which, as shown in FIG. 4, is a conformal thin layer deposited onto the surface of the substrate 22 and the sides and top of the wiring lines 20. The shape of the first HDPCVD layer 30 near the top of the wiring lines may be dictated by the bias component applied, and may preferably be faceted as shown in FIG. 4. The shape of the corner regions 31 near the tops of the wiring lines is important because subsequent steps will deposit material over the first HDPCVD layer 30 which helps to define the size and position of the void to be formed in the gap. Another purpose of the first HDPCVD layer 30 is to act as an additional protective layer for the wiring lines 20. To this end, certain preferred embodiments deposit as the first layer a silicon rich oxide (SRO, $SiO_{2-x}$), i.e., a silicon oxide having a greater concentration of silicon than is stoichiometric for silicon dioxide. After HDPCVD dielectric layer 30 has been deposited, a PECVD dielectric layer 32 is deposited in a manner so that PECVD dielectric material will build up near the top and sides of the wiring lines, as seen in FIG. 5. The PECVD layer builds up so that an opening 34 is formed in the gap 24. The deposition of the PECVD layer 32 is preferably stopped prior to the opening 34 being completely closed off, so that the opening can be capped with a harder HDPCVD material.

Figure 6:
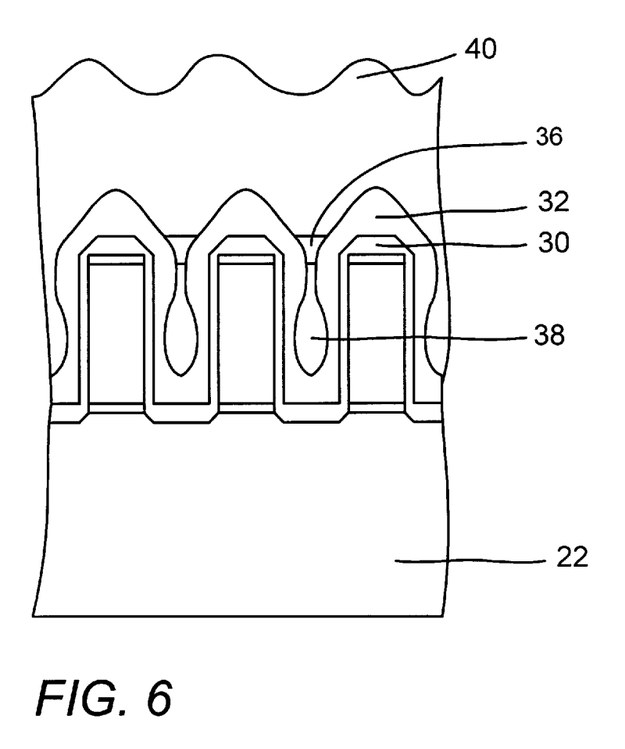

The closure of the opening 34 may then be accomplished using a second HDPCVD step to deposit a second HDPCVD layer 36, which caps the opening 34 to define void 38. Preferably the second HDPCVD layer 36 is deposited under conditions of a high etch to deposition rate. This will result in a portion of the preferred PECVD layer 32 being etched away and the void 38 being capped with a high density dielectric material. The HDPCVD material capping the trench will be more dense and harder than the PECVD material of layer 32. This means that the voids 38 will be less likely to be opened during polishing than if the void were capped with PECVD material. By controlling the etch rate, the layer 32 may be consistently etched so that an opening of relatively constant size and position can be formed and closed off using HDPCVD. The lower position of the void 38 when compared to the void 16 described above with reference to FIGS. 1 and 2 means that there is a decreased chance that the void 38 will be uncovered during subsequent processing steps. Furthermore, the position of the void 38 between the wiring lines 20 instead of partially above the wiring lines leads to a better use of the low dielectric constant of the void.

Depending on the subsequent steps to be performed, the area above the wiring lines and deposited layers may be further filled with a layer 40. The layer 40 may be selected from a variety of materials and formed using a variety of techniques. Preferably, layer 40 is chosen to be a PECVD oxide material, which can be deposited at a higher speed than is typical of present HDPCVD processes, or an HDPCVD material. If the layer 40 above the metal leads and gaps is an HDPCVD oxide, then the third step above for depositing HDPCVD oxide layer 36 may be continued so that layer 40 is also formed in the same step. As the deposition proceeds, the HDPCVD layer tends to self-planarize. Such a self-planarized layer requires less time for chemical mechanical processing (CMP) than a layer deposited using other techniques.

Figure 7:
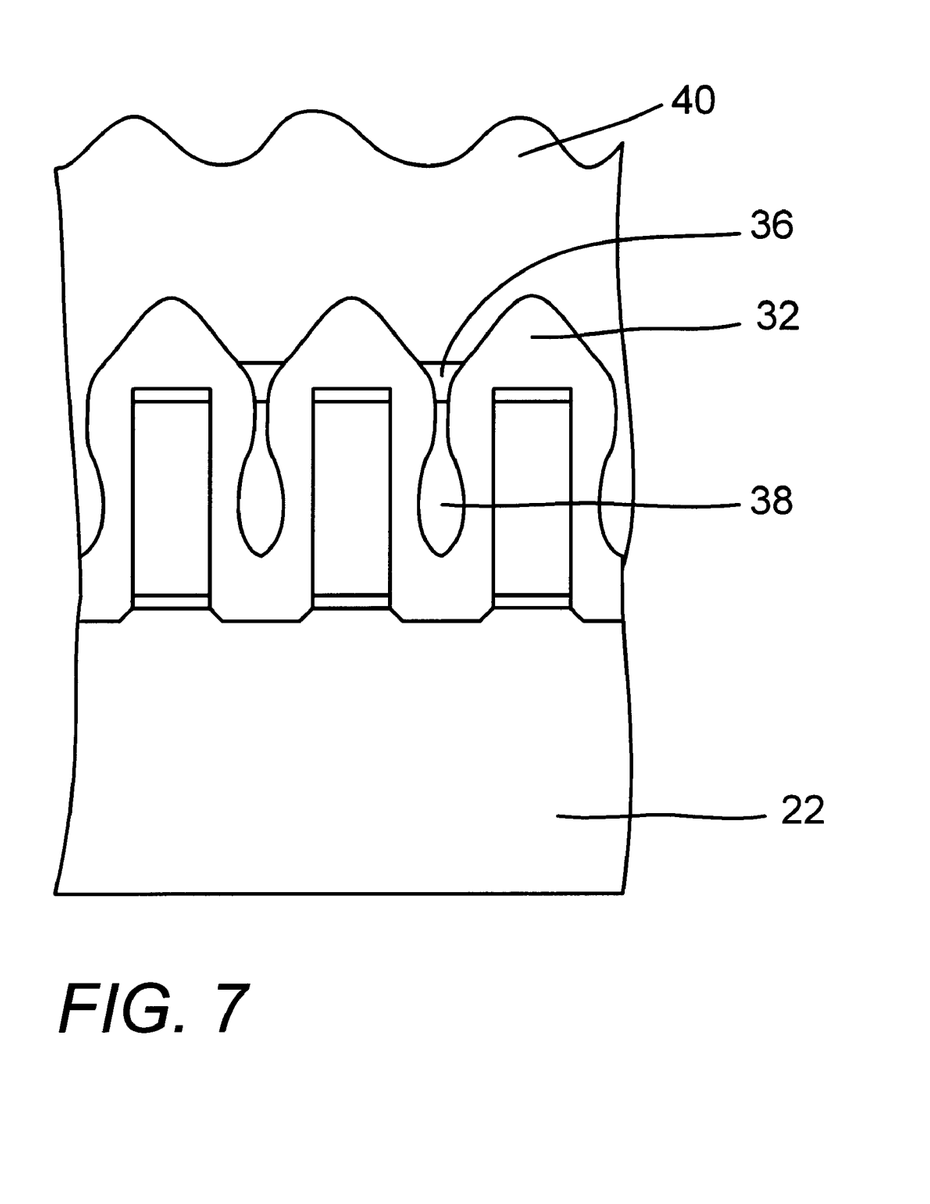

In another aspect of embodiments of the present invention, the first HDPCVD step described above, (which includes the deposition of an HDPCVD dielectric layer) may be eliminated and the first HDPCVD dielectric layer 30 replaced by PECVD layer 32, as shown in FIG. 7. Though less preferred than a process which uses an HDPCVD layer, using a PECVD layer eliminates one step in the process, because the first and second dielectric layers can be replaced by a single PECVD layer. If too much of the PECVD oxide overhangs the gap, the overhang can be etched during the subsequent HDPCVD step that utilizes a sputter bias component.

Figure 8:
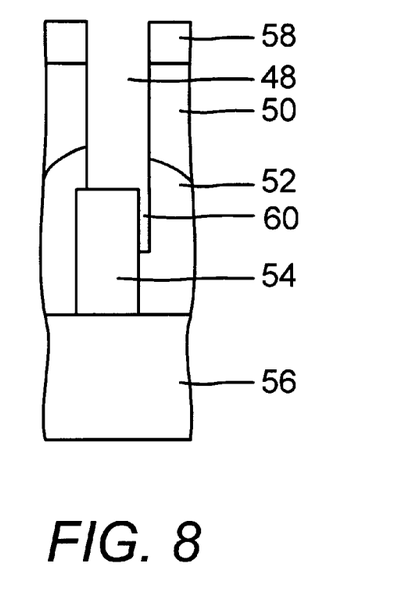
FIGS. 8 and 9 illustrate the formation of a via through dielectric material and contacting a wiring line.
Figure 9:
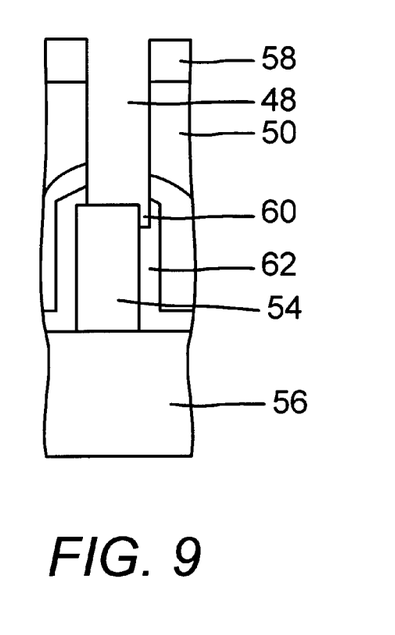

In another aspect of the present invention, forming an HDPCVD layer immediately adjacent to the wiring lines provides advantages for subsequent processes such as the formation of contact vias because an HDPCVD silicon oxide material tends to be harder and more dense than a PECVD silicon oxide material. As illustrated in FIG. 8, contact via 48 may be formed by etching through first dielectric layer 50 and second dielectric layer 52 to contact the top of a wiring line 54 disposed on a substrate 56. Misalignment of the mask 58 used for the etching process may lead to etching through the dielectric layers 50 and 52 and only partially contacting the top of the wiring line 54. The dielectric material directly adjacent to the wiring line, second dielectric layer 52, will be etched, and an opening 60 extending along the side of the wiring line 54 will be formed. Such an opening may trap etchant gases and other impurities and lead to reduced yields and/or decreased device performance. FIG. 8 shows an opening 60 formed when the dielectric layer 52 adjacent to the wiring line 54 is a PECVD silicon oxide material. FIG. 9 shows a smaller opening 60 formed when the dielectric layer 62 adjacent to the wiring line 54 is an HDPCVD silicon oxide material. The HDPCVD silicon oxide material is harder and will be etched less than the PECVD silicon oxide material. As a result, any opening formed during contact via formation will be smaller and problems due to impurities trapped in the opening will be minimized.

While the present invention has been described with particular emphasis on certain preferred embodiments of the present invention, the present invention is not limited to the particular embodiments described herein. For example, electrical isolation of components other than wiring lines may be accomplished using techniques such as those set forth above. The scope of the present invention is to be determined by the following claims.

What is claimed:

1. A method for forming a semiconductor device comprising the steps of:
    providing a substrate having a substrate surface;
    providing two conductive structures over the substrate surface, wherein the two conductive structures include first and second conductive structures that are separated from one another by an open gap;
    depositing a first dielectric layer using high density plasma chemical vapor deposition, the first dielectric layer deposited over the two structures and extending within the gap continuously along opposing sides of the two structures and the substrate surface;
    depositing a second dielectric layer using plasma enhanced chemical vapor deposition, the second dielectric layer deposited on top of the first dielectric layer without sealing off the gap, so as to define within the gap a single continuous void bounded on opposite sides and a bottom by portions the second dielectric layer; and
    capping the void with a third dielectric layer formed by high density plasma chemical vapor deposition, so that the void is defined by the portions of the second dielectric layer and a portion of the third dielectric layer.

2. The method as in claim 1, wherein said void includes bottom and side regions defined by the second dielectric layer and a top region defined by the third dielectric layer.

3. The method of claim 1, wherein the two conductive structures each comprises a bottom layer, a metal line, and a top layer, wherein the bottom layer is disposed between the substrate surface and the metal line and the metal line is disposed between the bottom layer and the top layer.

4. The method of claim 3, wherein the two conductive structures each include sidewalls and a top surface, and the first dielectric layer is deposited onto the sidewalls and the top surface of each of the conductive structures.

5. The method of claim 1, wherein the first dielectric layer includes portions having an angle of approximately 45 degrees with respect to a top surface of each of the conductive structures.

6. The method of claim 1, wherein the substrate is electrically biased to promote acceleration of ions toward the substrate during the deposition of the first dielectric layer.

7. The method of claim 6, wherein the substrate is electrically biased to promote acceleration of ions toward the substrate during the deposition of the third dielectric layer.

8. The method of claim 1, further comprising the deposition of a fourth dielectric layer above the third dielectric layer.

9. The method of claim 8, wherein the fourth oxide layer is deposited using plasma enhanced chemical vapor deposition.

10. The method of claim 9, wherein the fourth oxide layer is deposited using high density plasma chemical vapor deposition.

11. The method of claim 1, wherein the first, second and third dielectric layers are oxide materials.

12. The method of claim 11, wherein at least one of the first, second and third dielectric layers is an oxynitride material.

13. A method for forming a semiconductor device comprising the steps of:
    providing at least two conducting structures above a substrate, the conducting structures including first and second conducting structures separated by a gap;
    forming a first high density plasma chemical vapor deposition dielectric layer on and conformal to top and opposing side surfaces of the conducting structures;
    forming a plasma-enhanced chemical vapor deposition dielectric layer on top of the first high density plasma chemical vapor deposition layer;
    forming a void within the gap, the plasma-enhanced chemical vapor deposition dielectric layer at least partially defining both the void and an exposed opening communicating with the void; and
    forming a second high density plasma chemical vapor deposition dielectric layer on top of at least a portion of the plasma-enhanced chemical vapor deposition dielectric layer, the high density plasma chemical vapor deposition dielectric layer forming a cap to seal off the opening.

14. The method of claim 13, wherein the high density plasma chemical vapor deposition dielectric layer is harder than the plasma-enhanced chemical vapor deposition dielectric layer.

15. The method of claim 13, further comprising a high density plasma chemical vapor deposition dielectric layer beneath the plasma-enhanced chemical vapor deposition dielectric layer.

16. A method for forming a semiconductor device comprising:
    providing a substrate having at least one conducting structure thereon, the conducting structure having a top surface;
    depositing a high density plasma chemical vapor deposition material adjacent to the conducting structure;
    depositing a dielectric material above the conducting structure;
    forming a via through the dielectric material and contacting the top surface of the conducting structure, wherein the via also contacts a portion of the high density plasma chemical vapor deposition material adjacent to the top surface of the conducting structure.

17. The method of claim 16, wherein the via is unlanded.

18. The method of claim 17, wherein a small opening is formed through a portion of the high density plasma chemical vapor deposition material adjacent to the conducting structure.

19. The method of claim 16, further comprising an additional conducting structure, wherein portions of the structures are separated from one another by high density plasma chemical vapor deposition material, plasma-enhanced chemical vapor deposition material, and a void.

20. The method of claim 19, wherein the structures include a top surface and the void is positioned below the top surface of the structures, and high density plasma chemical vapor deposition material is positioned above the void.

21. The method of claim 16, wherein said depositing a dielectric material above the conducting structure includes depositing above the conducting structure dielectric material having a density lower than the high density plasma chemical vapor deposition material, by plasma enhanced chemical vapor deposition.

22. The method of claim 13, wherein the void is defined by both a portion of the second dielectric layer and a portion of the third dielectric layer.

23. The method of claim 1, wherein said depositing a first dielectric layer includes depositing the first dielectric layer over the two structures and within the gap both on the substrate surface and on opposing sidewalls of the two structures, wherein said depositing a second dielectric layer depositing the second dielectric layer over the portion of the first dielectric layer in the gap, and wherein said depositing a third dielectric layer includes depositing the third dielectric layer above the second dielectric layer, such that the third dielectric layer includes a portion over the gap so as to form a void in the gap between the portion of the third dielectric layer over the gap and the portion of the second dielectric layer in the gap.

24. A method for forming a semiconductor device comprising the steps of:
providing a substrate having a substrate surface;
providing two conductive structures over the substrate surface, wherein the two conductive structures include first and second conductive structures that are separated from one another by a gap;
depositing a first dielectric layer using high density plasma chemical vapor deposition, the first dielectric layer deposited on top of the two structures and within the gap from the first structure to the second conductive structure continuously on the substrate surface;
depositing a second dielectric layer using plasma enhanced chemical vapor deposition, the second dielectric layer deposited on top of the first dielectric layer, such that a void is formed in the gap, the void being exposed through an opening at least partially defined by the second dielectric layer; and
depositing a third dielectric layer using high density plasma chemical vapor deposition, the third layer deposited on top of a portion of the second dielectric layer and closing the opening, such that the void is surrounded by a portion of the second dielectric layer and a portion of the third dielectric layer.

25. The method as in claim 24, wherein said void includes bottom and side regions defined by the second dielectric layer and a top region defined by the third layer.

26. The method of claim 24, wherein each of the two conductive structures comprises a bottom layer, a metal line, and a top layer, wherein the bottom layer is disposed between the substrate surface and the metal, and the metal line is disposed between the bottom layer and the top layer.

27. The method of claim 26, wherein the two conductive structures include sidewalls and a top surface, and the first dielectric layer is deposited onto the sidewalls and the top surface of each of the first and second conductive structures and within the gap continuously along a continuous path on the substrate surface terminating at opposite ends at the sidewalls of each of the first and second conductive structures.

28. The method of claim 24, wherein the first dielectric layer includes portions having an angle of approximately 45 degrees with respect to a top surface of each of the conductive structures.

29. The method of claim 24, wherein the substrate is electrically biased during the deposition of the first dielectric layer.

30. The method of claim 24, wherein the substrate is electrically biased during the deposition of the third dielectric layer.

31. The method of claim 24, further comprising the deposition of a fourth dielectric above the third dielectric layer.

32. The method of claim 31, wherein the fourth oxide layer is deposited using plasma enhanced chemical vapor deposition.

33. The method of claim 32, wherein the fourth oxide layer is deposited using high density plasma chemical vapor deposition.

34. The method of claim 1, wherein the first dielectric layer is deposited so as to be conformal to and protect the conductive structures.

35. A method for forming a semiconductor device comprising the steps of:
providing at least two conducting structures above a substrate, the conducting structures including first and second conducting structures separated by a gap;
forming a first high density plasma chemical vapor deposition dielectric layer extending continuously from along a top surface of the first conducting structure, into the gap, along a bottom of the gap and onto and along a top surface of the second conducting structure;
forming a plasma-enhanced chemical vapor deposition dielectric layer on top of the first high density plasma chemical vapor deposition layer;
forming a void within the gap, the plasma-enhanced chemical vapor deposition dielectric layer at least partially defining both the void and an exposed opening communicating with the void; and
forming a second high density plasma chemical vapor deposition dielectric layer on top of at least a portion of the plasma-enhanced chemical vapor deposition dielectric layer, the high density plasma chemical vapor deposition dielectric layer forming a cap to seal off the opening.

* * * * *